(12) United States Patent
Yokomaku

(10) Patent No.: US 8,122,598 B2
(45) Date of Patent: Feb. 28, 2012

(54) MULTILAYER PRINTED WIRING BOARD AND COMPONENT MOUNTING METHOD THEREOF

(75) Inventor: Toshihiko Yokomaku, Ogaki (JP)

(73) Assignee: Ibiden Co., Ltd., Ogaki (JP)

(*) Notice: Subject to any disclaimer, the term of this patent is extended or adjusted under 35 U.S.C. 154(b) by 367 days.

(21) Appl. No.: 12/468,626

(22) Filed: May 19, 2009

(65) Prior Publication Data

US 2009/0229873 A1    Sep. 17, 2009

Related U.S. Application Data

(63) Continuation of application No. 11/689,858, filed on Mar. 22, 2007, now Pat. No. 7,566,835.

(30) Foreign Application Priority Data

Mar. 23, 2006  (JP) ................................. 2006-081664

(51) Int. Cl.
*H05K 3/34*    (2006.01)
(52) U.S. Cl. ............... 29/840; 29/830; 29/832; 29/842; 29/843; 228/180.22; 228/226; 228/245; 438/612; 257/737
(58) Field of Classification Search .............. 29/830, 29/832, 840, 842, 843; 228/180.22, 245–246, 228/226; 438/612; 257/737–738
See application file for complete search history.

(56) References Cited

U.S. PATENT DOCUMENTS

| | | | | |
|---|---|---|---|---|
| 5,729,440 A | * | 3/1998 | Jimarez et al. | 361/779 |
| 6,137,164 A | | 10/2000 | Yew et al. | 257/686 |
| 6,534,723 B1 | * | 3/2003 | Asai et al. | 174/255 |
| 2004/0188497 A1 | | 9/2004 | Gruber et al. | |
| 2004/0235221 A1 | | 11/2004 | Taguchi et al. | |
| 2006/0110859 A1 | | 5/2006 | Shigemura et al. | |
| 2006/0237225 A1 | | 10/2006 | Kariya et al. | 174/260 |
| 2008/0253100 A1 | | 10/2008 | Shigemura et al. | |

FOREIGN PATENT DOCUMENTS

| | | |
|---|---|---|
| JP | 2001-185842 | 7/2001 |
| JP | 2001-339006 | 12/2001 |

* cited by examiner

*Primary Examiner* — Derris Banks
*Assistant Examiner* — Azm Parvez
(74) *Attorney, Agent, or Firm* — Oblon, Spivak, McClelland, Maier & Neustadt, L.L.P.

(57) ABSTRACT

A component mounting method of a multilayer printed wiring board includes a plurality of solder bumps to mount electronic components formed on both of or either of the front and back thereof, wherein when the solder bumps are formed of any of first, second, third and fourth solders, the first, second, third and fourth solders have different melting points and the melting points of the first, second, third and fourth solders are arranged as the melting point of the first solder, the melting point of the second solder, the melting point of the third solder and the melting point of the fourth solder in order of high melting point and the first, second, third and fourth solders are sequentially used to solder electronic components and the like in order of high melting point. Further, in that case, it is preferable that the solder bump having large volume should be soldered earlier than other solder bumps. This multilayer printed wiring board is easy to mount components, excellent in work efficiency or easy in reworkable process and a mounting method of such multilayer printed wiring board is also provided.

12 Claims, 8 Drawing Sheets

| USEABLE SOLDER | RANGE OF MELTING POINT (° C) | EXAMPLE 1 | EXAMPLE 2 | EXAMPLE 3 |
|---|---|---|---|---|
| FIRST SOLDER | 232~260 | Sn/5Sb | Sn/5Sb | Sn/10Sb |
| SECOND SOLDER | 208~230 | Sn/3.5Ag | Sn/0.7Cu | Sn/3.0Ag/0.5Cu |
| THIRD SOLDER | 183~200 | Sn-3.5Ag-0.5Bi-4In | Sn/37Pb | Sn-8Zn-3Bi |

FIG. 6A

| USEABLE SOLDER | RANGE OF MELTING POINT (° C) | EXAMPLE 1 | EXAMPLE 2 | EXAMPLE 3 |
|---|---|---|---|---|
| FIRST SOLDER | 232~260 | Sn/5Sb | Sn/5Sb | Sn/10Sb |
| SECOND SOLDER | 208~230 | Sn/3.5Ag | Sn/0.7Cu | Sn/3.0Ag/0.5Cu |
| THIRD SOLDER | 183~200 | Sn-3.5Ag-0.5Bi-4In | Sn/37Pb | Sn-8Zn-3Bi |
| FOURTH SOLDER | 138~160 | Sn/58Bi | In | 80In/15Pb/5Ag |

FIG. 6B

MULTILAYER PRINTED WIRING BOARD AND COMPONENT MOUNTING METHOD THEREOF

CROSS REFERENCE TO RELATED APPLICATIONS

This application is a continuation of U.S. Ser. No. 11/689,858, filed Mar. 22, 2007, which claims priority to Japanese Patent Application No. 2006-81664, filed Mar. 23, 2006. The content of U.S. Ser. No. 11/689,858 is incorporated herein in its entirety. The content of JP2006-81664 is incorporated herein to the extent that it does not include new matter.

BACKGROUND OF THE INVENTION

1. Field of the Invention

The present invention relates to a multilayer printed wiring board and a component mounting method thereof, and more particularly to a multilayer printed wiring board capable of mounting a plurality of components and a component mounting method thereof.

2. Description of the Related Art

Multilayer printed wiring boards of the system for mounting components on both surfaces of a printed wiring board (double-sided mounting system) are widely used as a demand for higher performance is increased and surface-mounting technologies are developed increasingly. With respect to the double-sided surface-mounting multilayer printed wiring board, the assignee of the present application has already filed a patent application which is disclosed in the following Patent Document 1.

[Patent Document 1]: Japanese Patent Laid-open Publication No. 2001-339006 "MULTILAYER PRINTED WIRING BOARD" (published on Dec. 7, 2001).

FIG. 9 in the Patent Document 1 and the description (paragraph [0055]) of the relating patent specification read as follows. That is, an IC chip 90 and a chip capacitor 120 are mounted on the front of a multilayer printed wiring board 10 by solders and a conductive connection pin 180 is mounted on the back of the multilayer printed wiring board by solders. Here, a solder bump 176 to connect the IC chip 90 mounted on the surface of the multilayer printed wiring board is made of a solder of which composition is Sn/Pb, Sn/Ag or Sn/Ag/Cu. Melting points thereof are between 190 and 220° C. and reflow temperatures thereof are between 200 and 230° C. On the other hand, the solder 186 to connect the chip capacitor 120 mounted on the front of the multilayer printed wiring board and the conductive connection pin 180 mounted on the back of the multilayer printed wiring board is made of Sn/Sb solder, both of Sn and Sb having melting points ranging of from 247 to 254° C. (see No. 2 in FIG. 11).

SUMMARY OF THE INVENTION

In a multilayer printed wiring board to mount many types of components as is disclosed in the Patent Document 1, a development of a multilayer printed wiring board easier to mount components, excellent in work efficiency or easy in a reworkable (repair) process has been demanded.

Accordingly, the object of the present invention is to provide a multilayer printed wiring board easy to mount components, excellent in work efficiency or easy in reworkable process.

Further, the object of the present invention is to provide a method of mounting components on a multilayer printed wiring board easy to mount components, excellent in work efficiency or easy in reworkable process.

Under consideration for the above object, a multilayer printed wiring board on the present invention having a plurality of solder bumps to mount electronic components formed on both of or either of the front or back thereof, wherein said solder bumps are each formed of any of first, second and third solders, said first, second and third solders having different melting points.

Further, as to the multilayer printed wiring board, said melting points of said first, second and third solders may be arranged as the melting point of said first solder, the melting point of said second solder and the melting point of said third solder in order of high melting point.

Further, as to the multilayer printed wiring board, differences of melting points of said first, second and third solders may fall within a range of from 10° C. to 40° C.

Further, as to the multilayer printed wiring board, said differences of melting points of said first, second and third solders may be higher than 25° C.

Further, a multilayer printed wiring board of the present invention having a plurality of solder bumps to mount electronic components formed on both of or either of the front or back thereof, wherein said solder bumps have different volumes in response to mounted electronic components and the like.

Further, as to the multilayer printed wiring board, said solder bumps may be selected such that a ratio between a volume of a solder bump for mounting a surface-mounting component of flip-chip connection type and a volume of a solder bump for mounting a surface-mounting component of non-flip-chip connection type lies between 1:2 and 1:4.

Further, a multilayer printed wiring board of the present invention having a plurality of solder bumps to mount electronic components formed on both of or either of the front or back thereof, wherein said solder bumps are formed in response to component loads per connection points of mounted electronic components and the like.

Further, as to the multilayer printed wiring board, the volumes of said solder bumps may become relatively large as the component loads per connection points of the mounted electronic component and the like may become relatively large, said volumes of said solder bumps becoming relatively small as the component loads per connection points of the mounted electronic component and the like becoming relatively small.

Further, a multilayer printed wiring board of the present invention having a plurality of solder bumps to mount electronic components mounted on both of or either of the front or back thereof, wherein said solder bumps are formed of any of first, second, third and fourth solders, said first, second, third and fourth solders having different melting points.

Further, as to the multilayer printed wiring board, said melting points of said first, second, third and fourth solders may be arranged as the melting point of said first solder, the melting point of said second solder, the melting point of said third solder and the melting point of said fourth solder in order of high melting point.

Further, a component mounting method of a multilayer printed wiring board of the present invention having a plurality of solder bumps to mount electronic components formed on both of or either of the front and back thereof, wherein when said solder bumps are formed of any of first, second, third and fourth solders, said first, second, third and fourth solders having different melting points and said melting points of said first, second, third and fourth solders are arranged as the melting point of said first solder, the melting point of said second solder, the melting point of said third solder and the melting point of said fourth solder in order of high melting point, said first, second, third and fourth solders are sequentially used to solder electronic components and the like in order of high melting point.

Further, a component mounting method of a multilayer printed wiring board of the present invention having a plurality of solder bumps to mount electronic components formed on both of or either of the front and back thereof, wherein when said solder bumps to mount a flip-chip connection type surface-mounting component have relatively small volumes and said solder bumps to mount a non-flip-chip connection type surface-mounting component have relatively large volumes, solder bumps having larger volumes are soldered earlier than other solder bumps.

Further, a component mounting method of a multilayer printed wiring board of the present invention having a plurality of solder bumps to mount electronic components formed on both of or either of the front and back thereof, wherein said solder bumps having relatively small component loads per connection points of mounted electronic components and the like are soldered earlier than other solder bumps.

According to the present invention, it is possible to provide a multilayer printed wiring board easy to mount components, excellent in work efficiency or easy in reworkable process.

Further, according to the present invention, it is possible to provide a method of mounting components on a multilayer printed wiring board easy to mount components, excellent in work efficiency or easy in reworkable process.

BRIEF DESCRIPTION OF THE DRAWINGS

FIG. 6A is a table showing examples of compositions of solders that exhibit desired melting points and illustrate examples of combinations of first to third solders, each solder exhibiting a different melting point;

FIG. 6B is a table showing examples of compositions of solders that exhibit desired melting points and illustrate examples of combinations of first to fourth solders, each solder exhibiting a different melting point;

DESCRIPTION OF THE PREFERRED EMBODIMENTS

Figure 1:
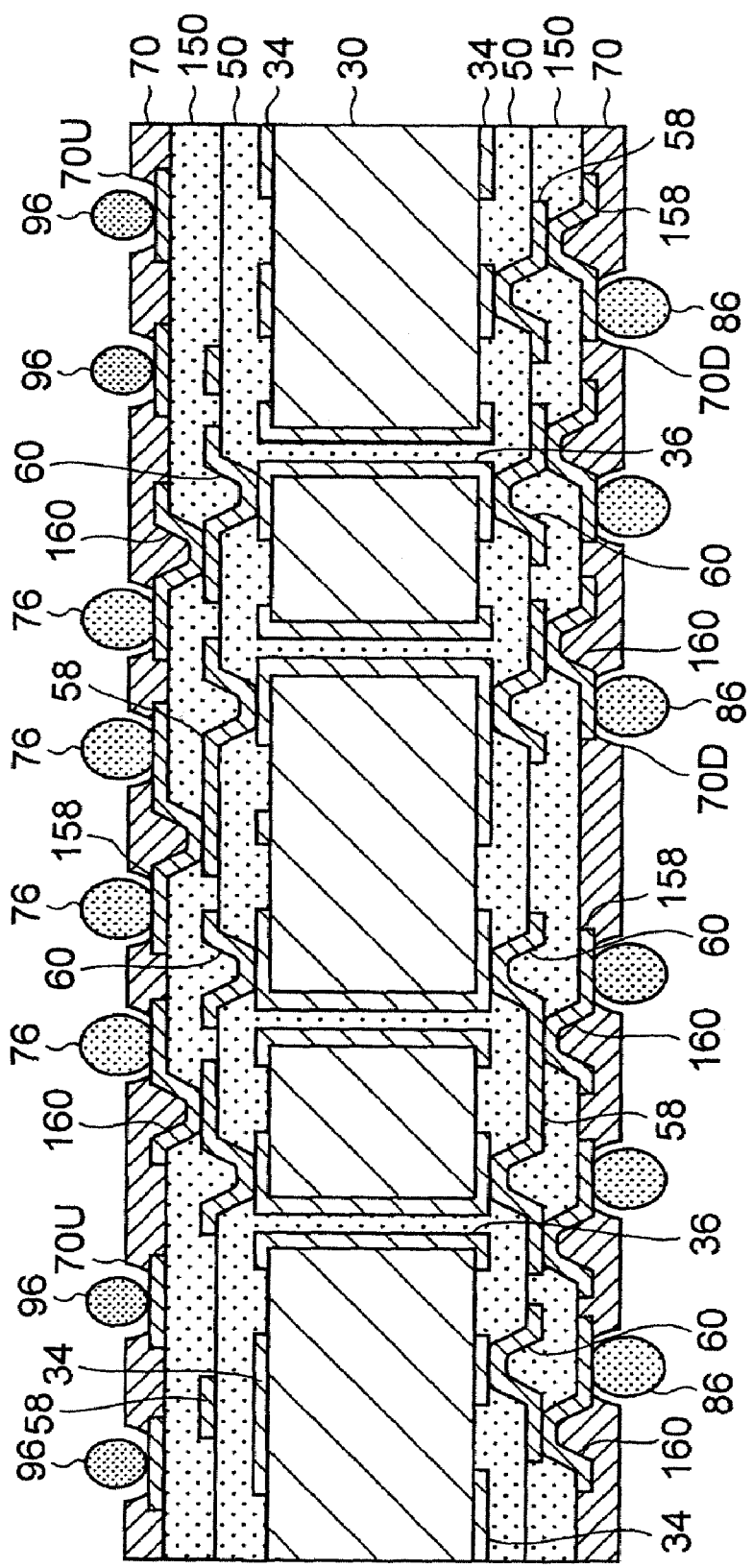
FIG. 1 is a diagram showing an example of an arrangement of a multilayer printed wiring board according to a first embodiment of the present invention.

A multilayer printed wiring board and its components mounting method according to the embodiments of the present invention will be described below in detail with reference to the accompanying drawings, wherein identical elements and parts are denoted by identical reference numerals and therefore need not be repeatedly described.

The embodiments of the present invention are characterized by a system to mount electronic components on a multilayer printed wiring board. The following mounting system can be applied to any multilayer printed wiring board except the items concerning the component mounting surface. Accordingly, general items of the multilayer printed wiring board except items that are directly related to the present invention will be described in brief.

[First Embodiment]

Figure 2:
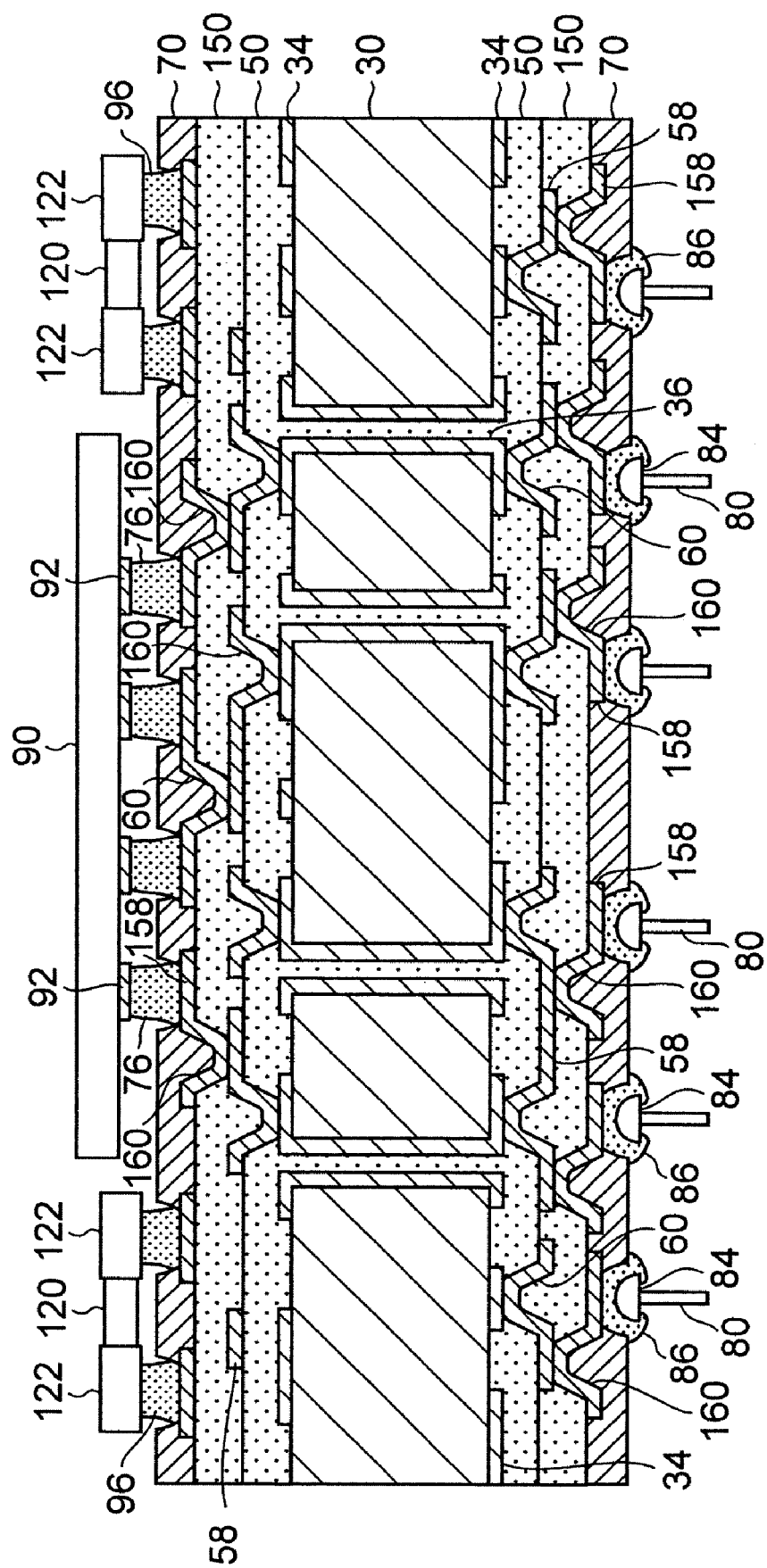
FIG. 2 is a diagram showing a state in which electronic components and the like are mounted on the multilayer printed wiring board shown in FIG. 1.

FIG. 1 is a diagram showing an example of an arrangement of a multilayer printed wiring board 10 according to a first embodiment of the present invention and FIG. 2 is a diagram showing a state in which electronic components and the like are mounted on this multilayer printed wiring board 10.

As shown in FIG. 1, in this multilayer printed wiring board 10, through-hole conductors 36 are formed within a core substrate 30 and conductor circuits 34 are respectively formed on both surfaces (front and back) of the core substrate 30.

Further, a lower-layer side interlayer resin insulating layer 50 in which via-hole conductors 60 and conductor circuits 58 are formed is disposed on the core substrate 30. Further, an upper-layer side interlayer resin insulating layer 150 in which via-hole conductors 160 and conductor circuit 158 are formed is disposed on this lower-layer side interlayer resin insulating layer 50. Further, a solder resist layer 70 is disposed on the upper-layer side interlayer resin insulating layer 150. However, the multilayer printed wiring board 10 may be any multilayer printed wiring board except the items concerning the component mounting surface.

Openings 70U and 70D are respectively formed on the solders resist layers 70 on the front side and the back side. Solder bumps 96 are formed in two openings 70U at right and left ends on the front side and solder bumps 76 are formed in four openings 70U at the center. On the other hand, solder bumps 86 are formed in six openings 70D of the back side.

As shown in FIG. 2, a flip-chip connection system surface-mounting component (e.g. IC) 90 is mounted on the multilayer printed wiring board 10 through the solder bumps 76 on the front side. Surface-mounting type components (e.g. chip capacitor) 120 which are other connection system than the flip-chip connection system (i.e. non-flip-chip connection, for example, terminal connection) are mounted on the multilayer printed wiring board 10 through the solder bumps 96. On the other hand, conductive connection pins 80 are mounted on the multilayer printed wiring board 10 through the solder bumps 86 on the back side in order to fit and connect the multilayer printed wiring board 10 into pin connectors (not shown) of the motherboard. FIG. 2 illustrates one kind of flip-chip connection component and two kinds of non-flip-chip connection components. However, the kinds of the components mounted on the front of the substrate and the back of the substrate and the number of the components are not limited to those shown in FIG. 2.

The first embodiment determines mounting of electronic components onto the multilayer printed wiring board 10 from the following standpoints.

(1) Melting point of solder
(2) Volume of solder bump (heat capacity)
(3) Form and mounting system of electronic component, etc.

First, a case to determine mounting of electronic component and the like on the multilayer printed wiring board 10 from the standpoint (1) of solder melting point will be described.

FIG. 6A will be referred to with respect to the solder melting point. FIG. 6A shows examples solder compositions that exhibit desired solder melting points. A first solder is selected such that its melting point may fall within a range of from 232 to 260° C. A second solder is selected such that its melting point may fall within a range of from 208 to 230° C. A third solder is selected such that its melting point may fall within a range of from 183 to 200° C. That is, in the sequential order of high temperature, an inequality expressed as "first solder melting point range>second solder melting point range>third solder melting point range" may be satisfied. The first to third solder melting points may not overlap with each other.

With respect to the differences of melting point ranges, the second solder is higher than the third solder by 25° C. and the first solder is higher than the second solder by 24° C. from the standpoint of the low temperature side melting point. From the standpoint of the high temperature side melting point, the second solder is higher than the third solder by 30° C. and the first solder is higher than the second solder by 30° C.

Three examples are shown as specific examples of the first to third solders. It should be noted that, while the solders of these compositions are shown by way of example, any solders of three groups of which melting point ranges do not overlap with each other can be used.

An example 1 can use a combination of "Sn/5Sb solder" made of 95 wt % of Sn (zinc) and 5 wt % of Sb (antimony) available as a first solder, "Sn/3.5Ag solder" made of 96.5 wt % of Sb and 3.5 wt % of Ag (silver) available as a second solder and "Sn-3.5Ag-0.5Bi-4In solder" made of 92 wt % of Sn, 3.5 wt % of Ag, 0.5 wt % of Bi (bismuth) and 4 wt % of In (indium) available as a third solder.

An example 2 can use a combination of "Sn/5Sb solder" made of 95 wt % of Sn and 5 wt % of Sb available as a first solder, "Sn/0.7Cu solder" made of 99.3 wt % of Sn and 0.7 wt % of Cu (copper) available as a second solder and "Sn/37Pb solder" made of 63 wt % of Sn and 37 wt % of Pb (lead) available as a third solder.

An example 3 can use a combination of "Sn/10Sb solder" made of 90 wt % of Sn and 10 wt % of Sb available as a first solder, "Sn/3.0Ag/0.5Cu solder" made of 96.5 wt % of Sn, 3.0wt % of Ag (silver) and 0.5 wt % of Cu available as a second solder and "Sn-8Zn-3Bi solder" made of 89 wt % of Sn, 8 wt % of Zn (zinc) and 3 wt % of Bi available as a third solder.

As described above, in the sequential order of high temperature, an inequality expressed as "the first solder melting point range>second solder melting point range>third solder melting point range" may be satisfied and these melting point ranges may not overlap with each other. Further, in any combinations of the examples 1 to 3, a melting point difference of each solder (first solder melting point range—second solder melting point range, second solder melting point range—third solder melting point range) should preferably fall within a range of from 10 to 40° C. It should be noted that, if a melting point difference exceeds 10° C, the mounted solder will never be fused. However, the experiences of the assignee of the present application can reveal that, if a melting point difference is less than 25° C., there is then a possibility that the mounted solder will be softened. If on the other hand a melting point difference exceeds 40° C., there is then a possibility in which, if components using a solder with a high melting point are mounted on a multilayer printed wiring board, then the multilayer printed wiring board will be damaged thermally. Desired melting points of solders can be realized by changing either compositions of solders or a quantity of each composition.

Accordingly, if components are mounted on the multilayer printed wiring board, then when the components are soldered on the multilayer printed wiring board by using the first, second and third solders in that order, the first solder can be prevented from being fused even though the second solder is fused (melting point of the first solder is higher than that of the second solder) and the first and second solder can be prevented from being fused even though the third solder is fused (melting points of the first and second solder are higher than that of the third solder).

This will be described more in detail with reference to the multilayer printed wiring board shown in FIG. 2. The first solder is used as the solder bump 96 for mounting the chip capacitor 120, the second solder is used as the solder bump 86 for mounting the conductive connection pin 80, the third solder is used as the solder bump 76 for mounting the IC 90, the conductive connection pins 80 are mounted on the multilayer printed wiring board 10 after the chip capacitor 120 was mounted and then the IC 90 is mounted. As a result, the soldered portion of the previously-mounted electronic components can be prevented from being fused again so that malconnection or disconnection can be prevented, the soldered portion can be prevented from being shifted in position and that the previously-mounted electronic components can be prevented from being dropped from the multilayer printed wiring board.

Next, a case to decide mounting of electronic components on the multilayer printed wiring board 10 from the standpoint (2) of the solder bump volume (heat capacity) will be described.

FIG. 6A illustrates the solders of various compositions. However, these solders of various compositions are all metals close to each other and it is to be considered that coefficients of heat transfer of respective solder bumps are substantially identical. Therefore, heat capacities of the respective solder bumps (in other words, times required until the whole of the solder bumps are fused) are proportional to the volumes of the respective solder bumps. Thus, if the volume of the solder bump is large, then the solder bump is difficult to be fused (needs a relatively long time to fuse). If on the other hand the volume of the solder bump is small, then the solder bump is easy to be fused (needs a short time to be fused).

Accordingly, when solders of which melting points are substantially similar are in use, a solder bump with a large volume is used first and a solder bump with a small volume is used later, whereby the soldered portion of the previously-mounted electronic components can be prevented from being fused again, the previously-mounted electronic components can be prevented from being displaced positionally and the previously-mounted electronic components can be prevented from being dropped from the multilayer printed wiring board.

This embodiment will be described with reference to the components mounted on the multilayer printed wiring board shown in FIG. 2 will be described. When solders with similar melting points are in use, the volume of the solder bump 76 for mounting the IC 90 is relatively small as compared with that of the solder bump 96 for mounting the chip capacitor 120. Accordingly, the IC 90 is mounted on the multilayer printed wiring board after the chip capacitor 120 was mounted on the multilayer printed wiring board. As a result, a possibility that the soldered portion such as the previously-mounted electronic component will melt again to cause malsolder because the first and third solders have a relatively large difference in melting point (alternatively, second and fourth solders, which will be described later in the second embodiment, have a relatively large difference in melting point).

Accordingly, the following table 1 describes characteristics obtained when first to third solders are employed as specific examples of solders, wherein respective solders are classified as a solder with a relatively large volume (hereinafter simply referred to as a "large solder") or a solder with a relatively small volume (hereinafter simply referred to as a "small solder").

TABLE 1

| No. | Mounting order of three kinds of components | Characteristics |
|---|---|---|
| 1 | Large solder → large solder → small solder | First solder is large solder and hence first solder is difficult to be fused and softened when second solder is fused. |
| 2 | Large solder → small solder → large solder | Melting point of first solder can be lowered in addition to characteristic of No. 1. Although second solder has small heat capacity so that it can be fused in a short time, first solder has large heat capacity so that it needs plenty of time to be softened. Thus, even when melting points of first and second solders are made close to each other (e.g. 10 to 30° C.), first solder is difficult to be softened. |
| 3 | Large solder → small solder → small solder | In addition to characteristics of Nos. 1 and 2, second and third solders have small heat capacities and total thermal budget can be decreased. |
| 4 | Small solder → large solder → large solder | First solder has small heat capacity and a time to expose mounted components to maximum temperature can be decreased. |
| 5 | Small solder → large solder → small solder | In addition to characteristic of No. 4, a time to expose mounted components to heat generated when third solder is fused can be decreased and hence thermal damage can be decreased. |
| 6 | Small solder → small solder → large solder | In addition to characteristic of No. 5, second solder has small heat capacity and hence a time to expose mounted components to high temperature can be decreased and components mounted by first solder are difficult to be shifted in position. | connection or disconnection to take place or to cause the electronic component to be displaced in position or to cause the electronic component to be dropped from the multilayer printed wiring board can be decreased.

Further, a case in which solders with different melting points are available, that is, a case in which mounting of electronic components and the like on the multilayer printed wiring board 10 is to be determined based on a combination of a standpoint of volumes (heat capacities) of solder bumps and a standpoint of melting points of solders will be described.

When a plurality of components are mounted on the multilayer printed wiring board by using solders of three kinds or more, the important points that should be considered in particular are a melting point of a first solder, a time required to mount components on the multilayer printed wiring board by the first solder and whether positional displacement, dropping and malconnection or disconnection are caused in the mounted component when other component is to be mounted later on. The reason for this is that the melting point of the first solder and the time required for mounting the component on the multilayer printed wiring board by the first solder affect a maximum temperature at which the multilayer printed wiring board is exposed and a time during which the multilayer printed wiring board is exposed to the maximum temperature. Also, whether or not the above-mentioned defects are caused in the mounted component when other component is mounted on the multilayer printed wiring board later on should be considered up to the mounting of component by a second First, the cases in which the solder bumps of which volumes (heat capacities) are relatively large as in the Nos. 1 to 3 on the table 1 are made of solders with relatively high melting points will be described. As shown in FIG. 2, a land 92 of a flip-chip connection system surface-mounting component (e.g. IC 90) and a land (conductor circuit) 158 of the multilayer printed wiring board 10 are connected through the solder bump 76. The mounting area of the IC 90 includes relatively many connection points (the number of the lands 92 of the IC 90 and the number of the lands 158 of the multilayer printed wiring board 10), that is, 2,000 to 30,000 connection points and hence the volume of the solder bump 76 is relatively small.

On the other hand, a terminal 122 of a non-flip-chip connection system (e.g. terminal connection) system surface-mounting component (e.g. chip capacitor 120) on the same mounting surface and the land (conductor circuit) 158 of the multilayer printed wiring board 10 are connected through the solder bump 96. Since the number of connection points is relatively as small as two, the volume of the solder bump 96 is relatively large. The experiences of the inventor of the present application can reveal that a volume ratio of the solder bump 76 and the solder bump 96 should preferably be selected as approximately 1:2 to 1:4.

Accordingly, as is described in the Nos. 1 to 3 on the table 1, when two kinds of non-flip-chip components (large solders are available) and one kind of flip-chip component (small solder is available) are mounted on the multilayer printed wiring board 10, if the non-flip-chip component, the non-flip-chip component and the flip-chip component are mounted on the multilayer printed wiring board 10 in that order, the characteristics described on the No. 1 of the above table 1 can be obtained. If the non-flip-chip component, the flip-chip component and the non-flip-chip component are mounted on the multilayer printed wiring board 10 in that order, the characteristics described on the No. 2 of the above table 1 can be obtained. Also, when one kind of non-flip-chip component (large solder is available) and two kinds of flip-chip components (small solders are available) are mounted on the multilayer printed wiring board 10, if the non-flip-chip component, the flip-chip component and the flip-chip component are mounted on the multilayer printed wiring board in that order, the characteristics described on the No. 3 of the above table 1 can be obtained.

Next, the cases in which the solder bumps of which volumes (heat capacities) are relatively small as in the Nos. 4 to 6 on the table 1 are made of solders with relatively high melting points will be described. In this case, the solder (first solder) with the relatively high melting point is used as the solder bump 76 with a relatively small heat capacity for use in mounting the IC 90, the solder (second solder or third solder) with a relatively low melting point is used as the solder bump 96 with a relatively large heat capacity for use in mounting the chip capacitor 120 and the IC 90 which is mounted on the multilayer printed wiring board 10 prior to the chip capacitor 120.

Since the solder bump 76 to connect the IC 90 to the multilayer printed wiring board 10 is relatively small in heat capacity, it can be fused in a short time and hence it is possible to decrease a time during which the multilayer printed wiring board 10 is exposed to the high fusing temperature of the first solder.

Accordingly, as is described in the Nos. 4 to 6 on the table 1, when two kinds of non-flip-chip components (large solders are available) and one kind of flip-chip component (small solder is available) are mounted on the multilayer printed wiring board 10, if the flip-chip component, the non-flip-chip component and the non-flip-chip component are mounted on the multilayer printed wiring board 10 in that order, the characteristics described on the No. 4 of the table 1 can be obtained. Also, if one kind of the non-flip-chip component (large solder is available) and two kinds of the flip-chip components (small solder is available) are mounted on the multilayer printed wiring board 10, if the flip-chip component, the non-flip-chip component and the flip-chip component are mounted on the multilayer printed wiring board 10 in that order, the characteristics described on the No. 5 of the table 1 can be obtained. If the flip-chip component, the flip-chip component and the non-flip-chip component are mounted on the multilayer printed wiring board in that order, the characteristics described on the No. 6 of the table 1 can be obtained.

Next, the standpoint (3) of the form and mounting system of the electronic component and the like will be described.

As shown in FIG. 2, the number of the connection point to connect the land 92 of the flip-chip connection system surface-mounting type component (e.g. IC 90) and the land (conductor circuit) 158 of the multilayer printed wiring board 10 is relatively as large as 2,000 to 30,000. On the other hand, the number of the connection point to connect the terminal 122 of the non-flip-chip connection system (e.g. terminal connection) surface-mounting type component (e.g. chip capacitor 120) on the same mounting surface and the land (conductor circuit) 158 of the multilayer printed wiring board 10 is relatively as small as two. It is customary that, even though these mounted electronic components are different in weight from each other, a difference between the connection points is very large as compared with a difference between the component weights. Accordingly, the component weight per connection point (i.e. component load/connection point) of the IC 90 is very light as compared with that of the chip capacitor 120.

Accordingly, when the solders with similar melting points are in use and a plurality of kinds of electronic components are mounted on the multilayer printed wiring board 10, if an electronic component of which component weight per connection point is light is mounted on the multilayer printed wiring board 10 first and an electronic component of which component weight per connection point is heavy is mounted on the multilayer printed wiring board 10 later on, then a load imposed on the soldered portion of the previously-mounted electronic component and the like is relatively small. Hence, malconnection or disconnection can be prevented from being caused, the mounted electronic component can be prevented from being displaced positionally and it can be prevented from being dropped from the multilayer printed wiring board.

This will be described with reference to the multilayer printed wiring board 10 shown in FIG. 2. The load per connection point of the IC 90 is relatively small as compared with the load per connection point of the chip capacitor 120. Accordingly, the chip capacitor 120 is mounted on the multilayer printed wiring board 10 after the IC 90 was mounted on the multilayer printed wiring board 10. As a result, malconnection or disconnection can be prevented from being caused in the soldered portion of the previously-mounted electronic component, it can be prevented from being displaced positionally and it can be prevented from being dropped from the multilayer printed wiring board 10.

Conversely, an electronic component of which load per connection point is large may be mounted on the multilayer printed wiring board 10 first and an electronic component of which load per connection point is small may be mounted on the multilayer printed wiring board 10 later on. According to this arrangement, a reworkable process of the component having many connection points becomes easy. Also, the component having many connection points becomes difficult to be displaced in position. Further, relationships among the form and mounting system of electronic component and the like and a volume (heat capacity) of a solder bump will be considered.

Relationships obtained when the electronic component and the like are mounted on the multilayer printed wiring board 10 by combining the standpoint of the form and mounting system of the electronic component and the like and the standpoint of melting point of the solder are as follows.

(i) A solder bump at a portion of which load per connection point (i.e. comparatively large volume) is large is made of a solder with a relatively high melting point. The reason for this is to prevent a first soldered solder bump with a relatively high melting point from being easily fused again when a solder bump with a low melting point is fused later so that malconnection or disconnection, positional displacement of the soldered portion and the like can be prevented.

(ii) A solder bump of which load per connection point is small (i.e. relatively small volume) is made of a solder with a relatively high melting point. The reason for this is to minimize a thermal damage of the multilayer printed wiring board by decreasing a time during which the multilayer printed wiring board is exposed to a high temperature as much as possible.

As described above, from any one of the standpoints of the standpoint (1) of the melting point of solder, the standpoint (2) of the volume (heat capacity) of solder bump or the standpoint (3) of the form and mounting system of electronic component and the like, composition, shape, mounting order of component and the like of the solder bump of the multilayer printed wiring board are determined. Further, composition, shape and component mounting order of the solder bump of the multilayer printed wiring layer are to be determined taking the standpoint (1) of the melting point of the solder into consideration in addition to a difference of the standpoint (2) of the volume (heat capacity) of the solder bump or taking the standpoint (1) of the melting point of the solder in addition to a difference of the standpoint (3) of the form and mounting system of the electronic component and the like. More specifically, these mounting systems may be individually determined in response to specific combinations of the multilayer printed wiring board, the electronic component and the like.

[Second Embodiment]

Figure 3:
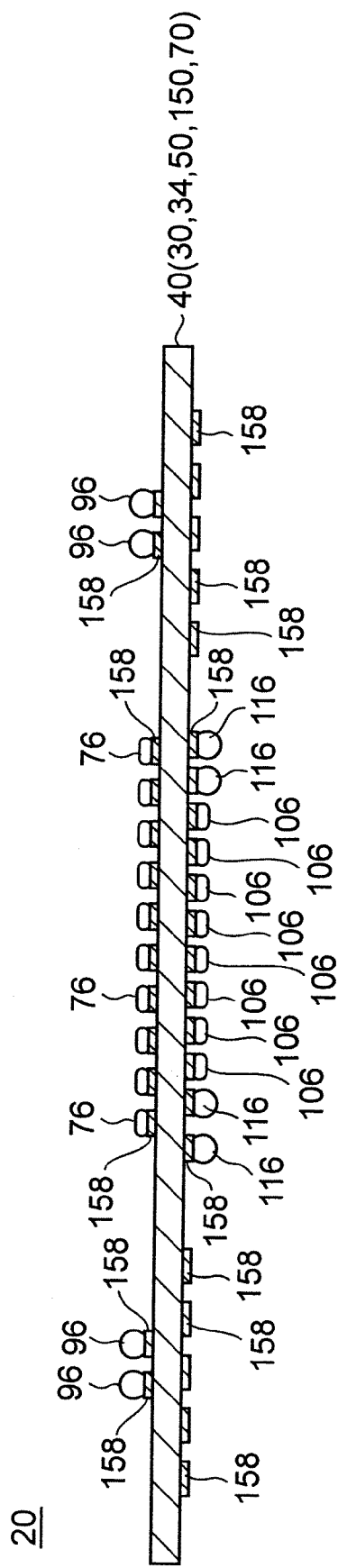
FIG. 3 is a diagram showing an example of an arrangement of a multilayer printed wiring board according to a second embodiment of the present invention.
Figure 4:
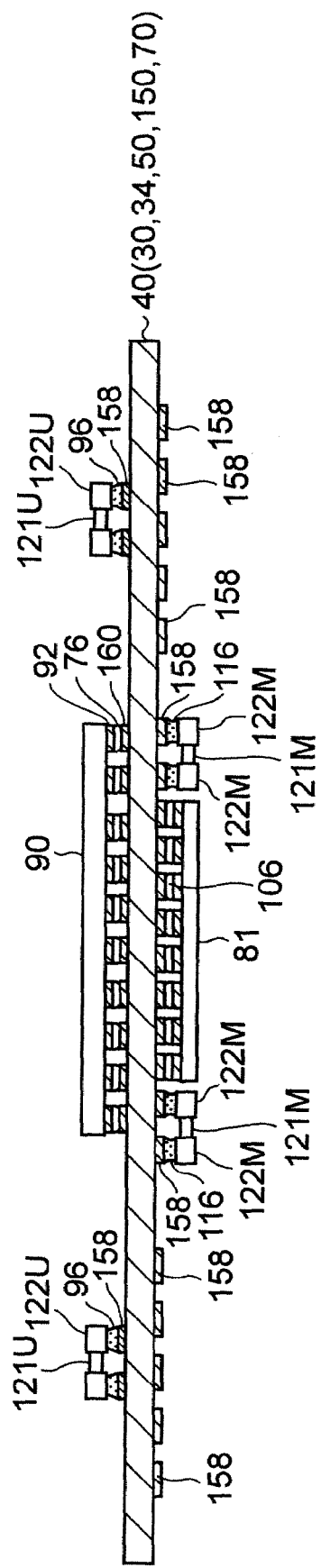
FIG. 4 is a diagram showing a state in which electronic components and the like are mounted on the multilayer printed wiring board shown in FIG. 3.

FIG. 3 is a diagram showing an example of an arrangement of a multilayer printed wiring board 40 according to a second embodiment of the present invention, and FIG. 4 is a diagram showing a state in which electronic components and the like are mounted on this multilayer printed wiring board 40.

Since the multilayer printed wiring board 40 shown in FIG. 3 is substantially the same as the multilayer printed wiring board 10 shown in FIG. 1, the core substrate 30, the conductor circuit 34, the lower-layer side interlayer resin insulating layer 50, the upper-layer side interlayer resin insulating layer 150 and the solder resist layer 70 are shown as a single substrate in FIG. 3.

A plurality of openings (not shown) are formed on solder resist layers (not shown) on the front side and the back side, solder bumps 96 are formed in right and left two openings on the front side and the solder bumps 76 are formed in ten openings at the middle. On the other hand, solder bumps 106 are formed on central eight via-holes at the middle of the back side, and solder bumps 116 are formed on respective two via-holes at both ends.

As shown in FIG. 4, a flip-chip connection system surface-mounting type component (e.g. IC) 90 is mounted on the multilayer printed wiring board 40 through the solder bumps 76 on the front side. Further, a non-flip-chip connection system (e.g. connection terminal) surface-mounting type component (e.g. chip capacitor) 121U is mounted on the multilayer printed wiring board 40 through the solder bumps 96. On the other hand, a flip-chip connection system surface-mounting type component (e.g. memory) 81 is mounted on the multilayer printed wiring board 40 through the solder bumps 106 on the back side. Further, a non-flip-chip connection system (e.g. terminal connection) surface-mounting type component (e.g. chip capacitor) 121M is mounted on the multilayer printed wiring board 40 through the solder bumps 116. FIG. 4 illustrates two kinds of flip-chip connection components and forms of two kinds of non-flip-chip connection components. However, the kind of the components mounted on the front and back of the substrate and the number of the components are not limited to those shown in FIG. 4. For example, four kinds of components may be mounted on one side. Alternatively, three kinds of components may be mounted on one surface and one kind of component may be mounted on the other surface.

Similarly to the first embodiment of the present invention, the second embodiment encounters with the following problems that should be solved when electronic components and the like are mounted on the multilayer printed wiring board 40.

(1) Melting point of solder
(2) Volume (heat capacity) of solder bump
(3) Form and mounting system of electronic component, etc.

First, a case to determine mounting of electronic component and the like on the multilayer printed wiring board 40 from the standpoint (1) of solder melting point will be described.

FIG. 6B will be referred to with respect to the solder melting point. FIG. 6B shows examples of solder compositions that exhibit desired solder melting points. A first solder is selected such that its melting point may fall within a range of from 232 to 260° C. A second solder is selected such that its melting point may fall within a range of from 208 to 230° C. A third solder is selected such that its melting point may fall within a range of from 183 to 200° C. A fourth solder is selected such that its melting point may fall within a range of from 183 to 200° C. That is, in the sequential order of high temperature, an inequality expressed as "first solder melting point range>second solder melting point range>third solder melting point range>fourth solder melting point range" may be satisfied. The first to fourth solder melting point ranges may not overlap with each other.

With respect to the differences of the melting point ranges, the third solder is higher than the fourth solder by 45° C., further, the second solder is higher than the third solder by 25° C. and further, the first solder is higher than the second solder by 24° C. from the standpoint of the melting points of the low temperature side. From the standpoint of the melting points of the high temperature side, the third solder is higher than the fourth solder by 40° C., further the second solder is higher than the third solder by 30° C., and further the first solder is higher than the second solder by 30° C.

Three examples are shown as specific examples of the first to fourth solders. It should be noted that, while the solders of these compositions are shown by way of example, any solders of four groups of which melting point ranges do not overlap with each other can be used.

An example 1 can use a combination of "Sn/5Sb solder" made of 95 wt % of Sn (zinc) and 5 wt % of Sb (antimony) available as a first solder, "Sn/3.5Ag solder" made of 96.5 wt % of Sb and 3.5 wt % of Ag (silver) available as a second solder, "Sn-3.5Ag-0.5Bi-4In solder" made of 92 wt % of Sn, 3.5 wt % of Ag, 0.5 wt % of Bi (bismuth) and 4 wt % of In (indium) available as a third solder and "Sn/58Bi solder" made of 42 wt % of Sn and 58 wt % of Bi available as a fourth solder.

An example 2 can use a combination of "Sn/5Sb solder" made of 95 wt % of Sn and 5 wt % of Sb available as a first solder, "Sn/0.7Cu solder" made of 99.3 wt % of Sn and 0.7 wt % of Cu (copper) available as a second solder, "Sn/37Pb solder" made of 63 wt % of Sn and 37 wt % of Pb (lead) available as a third solder and "In solder" made of 100 wt % of In.

An example 3 can use a combination of "Sn/10Sb solder" made of 90 wt % of Sn and 10 wt % of Sb available as a first solder, "Sn/3.0Ag/0.5Cu solder" made of 96.5 wt % of Sn, 3.0 wt % of Ag (silver) and 0.5 wt % of Cu available as a second solder, "Sn-8Zn-3Bi solder" made of 89 wt % of Sn, 8 wt % of Zn (zinc) and 3 wt % of Bi available as a third solder and "80n/15Pb/5Ag solder" made of 80 wt % of In, 15 wt % of Pb and 5 wt % of Ag available as a fourth solder.

As described above, in the sequential order of high temperature, an inequality expressed as "the first solder melting point range>second solder melting point range>third solder melting point range>fourth solder melting point range" may be satisfied and these melting point ranges may not overlap with each other. Further, in any combinations of the examples 1 to 4, if a difference of melting points is greater than 10° C., then the mounted solder will never be fused. However, the experiences of the inventor of the present application can reveal that, if a melting point difference is less than 25° C., there is then a possibility that the mounted solder will be softened. If on the other hand a melting point difference exceeds 40° C., there is then a possibility that, when components using a solder with a high melting point are mounted on the multilayer printed wiring board 40, the multilayer printed wiring board 40 will be damaged thermally.

Accordingly, if the components are mounted on the multilayer printed wiring board, then when the components are soldered on the multilayer printed wiring board by using the first, second, third and fourth solders in that order, the first solder can be prevented from being fused when the second solder is melted, the first and second solders can be prevented from being fused when the third solder is fused (melting points of the first and second solders are higher than that of the third solder) and the first, second and third solders can be prevented from being fused when the fourth solder is fused (melting points of the first, second and third solders are higher than that of the fourth solder).

In the multilayer printed wiring board 40 shown in FIG. 4, after the chip capacitor 121U was mounted, the IC 90 was mounted on the multilayer printed wiring board 40 by using the solder bump 96 formed of the first solder to mount the chip capacitor 121U, the solder bump 76 made of the second solder to mount the IC 90, the solder bump 106 made of the third solder to mount the memory 81 and the solder bump 116 made of the fourth solder to mount the chip capacitor 121M, whereafter the memory 81 is mounted on the multilayer printed wiring board 40 and then the chip capacitor 121M is mounted on the multilayer printed wiring board 40. As a result, the soldered portion of the previously-mounted electronic component can be prevented from being fused again, malconnection or disconnection can be prevented, positional displacement can be prevented and the mounted electronic components can be prevented from being dropped from the multilayer printed wiring board 40.

Next, standpoints of the volumes (heat capacities) of the solder bumps and standpoints of the forms of the electronic components and the mounting system of the electronic components and the like which had been described so far in the first embodiment can be applied to the second embodiment of the present invention just as they are. As was described in the first embodiment, when a plurality of components are mounted on the multilayer printed wiring board by using three kinds of solders or more, the important points that should be considered in particular are a melting point of a first solder, a time required to mount component on the multilayer printed wiring board by the first solder and whether positional displacement, dropping and malconnection or disconnection are caused in the mounted component when other component is to be mounted later on. The reason for this is that the melting point of the first solder and the time required for mounting the component on the multilayer printed wiring board by the first solder affect a maximum temperature at which the multilayer printed wiring board is exposed and a time during which the multilayer printed wiring board is exposed to the maximum temperature.

As described above, compositions and shapes of the solder bumps, component mounting orders and the like of the multilayer printed wiring board should be determined from any one of the standpoint (1) of the solder melting points, the standpoint (2) of the volumes (heat capacities) of the solder bumps or the standpoint (3) of the forms and mounting systems of the electronic components and the like. Further, compositions and shapes of the solder bumps, component mounting orders and the like of the multilayer printed wiring board should be determined should be determined taking the standpoint (1) of the solder melting points into consideration in addition to the difference of the standpoint (2) of the volumes (heat capacities) of the solder bumps or compositions and shapes of the solder bumps, component mounting orders and the like of the multilayer printed wiring board should be determined taking the standpoint (1) of the melting points of solders into consideration in addition to the difference of the standpoint (3) of the forms and mounting systems of the electronic components and the like. Specifically, these mounting systems may be individually determined in response to specific combinations of the multilayer printed wiring board, the electronic components and the like.

Figure 5:
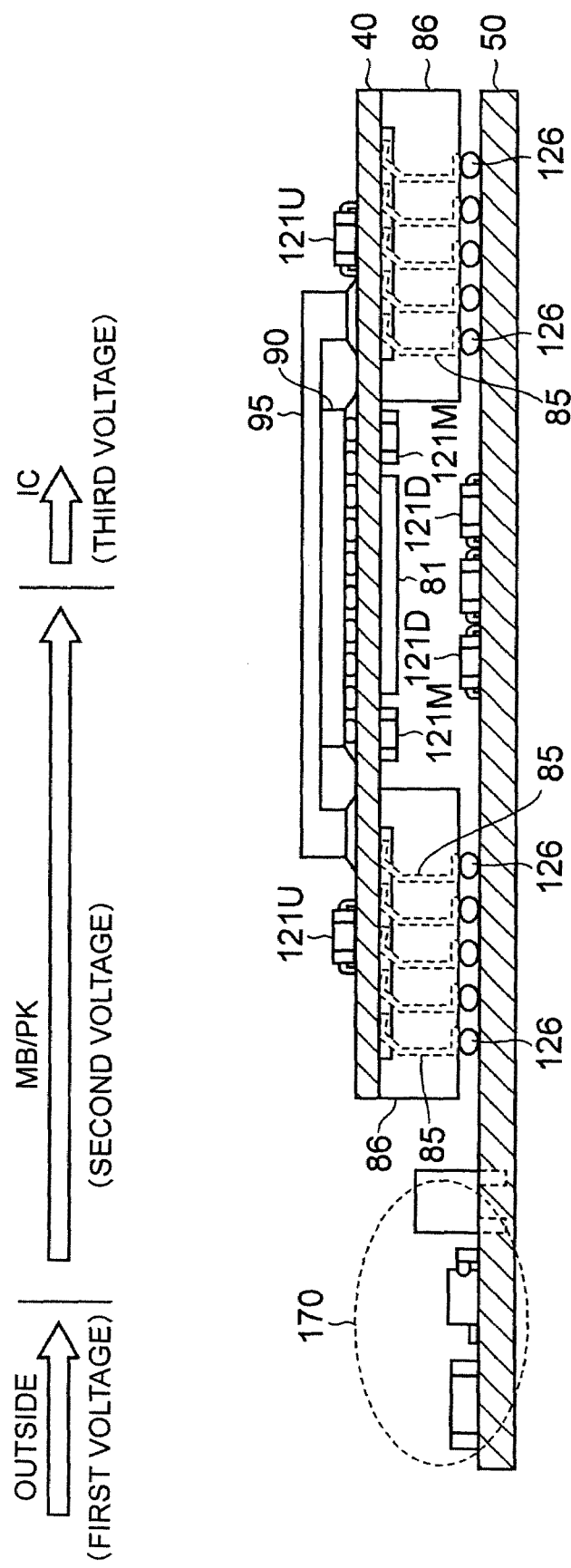
FIG. 5 is a diagram to which reference will be made in explaining an example of the manner to use the multilayer printed wiring board shown in FIG. 4.

FIG. 5 is a diagram showing an example in which the multilayer printed wiring board 40 with components mounted thereon shown in FIG. 4 are in use. The multilayer printed wiring board (PK, package) 40 has the IC (flip-chip connection system surface-mounting type component) 90 mounted on the front side, a heat sink (coupled to the substrate by adhesive) 95 mounted so as to surround the IC 90 and the chip capacitor (non-flip-chip connection system surface-mounting type component) 121U mounted on the front side and it also includes a semiconductor device immediate voltage adjuster (IVR die; flip-chip connection system surface-mounting type component) 81 and the chip capacitor (non-flip-chip connection system surface-mounting type component) 121M mounted on the back side.

Separately, a motherboard secondary voltage adjuster (Secondary MB VR) 170, connection pin holders 126 for holding a plurality of connection pins 85 through the solder bumps 86 and a chip capacitor 121D are mounted on the motherboard 50 on which the components were mounted.

Thereafter, the motherboard 50 with the components mounted thereon is properly positioned on the back side of the multilayer printed wiring board 40 on which the components are mounted and the connection pins 85 are urged against the conductor circuit of the package 40, thereby the multilayer printed wiring board being completed.

In the example shown in FIG. 5 in which the multilayer printed wiring board is in use, a first voltage (e.g. 100V) from the outside is broken down to a second voltage (e.g. 9 to 12V) by the motherboard secondary voltage adjuster 170 at the entrance of the motherboard 50, the second voltage is supplied through the motherboard 50 and the package 40, broken down to a third voltage (IC supply voltage, e.g. 0.8 to 3.0V) by the semiconductor device immediate voltage adjuster 81 and supplied to the IC 90.

It has been customary that the extraneous first voltage is broken down to the third voltage (0.8 to 3.0V) at the entrance of the motherboard 50, the third voltage being supplied through the motherboard 50 and the package 40 to the IC 90. As compared therewith, according to the useable example shown in FIG. 5, it becomes possible to supply the relatively high second voltage through the motherboard 50 and the package 40 by effectively utilizing the above-mentioned component mounting method for the package 40 and hence the multilayer printed wiring board becomes difficult to be affected by extraneous electromagnetic waves to thereby increase operation speeds of electronic equipment.

[Manufacturing Method of Printed Wiring Board]

An example of a manufacturing method of multilayer printed wiring board used in the above-described first and second embodiments will be described in brief. Plating via-hole methods and new system process methods are known as the multilayer printed wiring board manufacturing method. As the new system process methods, there are known a build-up process based on plating method, a build-up process based on conductive paste method, a build-up transfer method, a transfer method, a stack-via build-up method, a single step press method and the like. Further, the build-up process based on plating method is classified into a resin-coated copper foil system, a thermosetting resin system and a photosensitive resin system and the like depending on materials and microvia methods. Here, the multilayer printed wiring board manufacturing method will be described with reference to the thermosetting resin system of the build-up process based on plating method which is relatively frequently employed by the assignee of the present application.

Figure 7A:
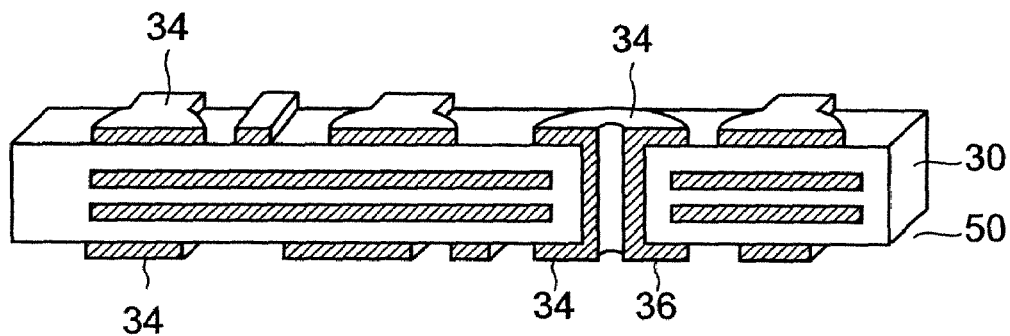
FIG. 7A is a diagram to which reference will be made in explaining a treatment process to prepare a core substrate in a multilayer printed wiring board manufacturing process.

As shown in FIG. 7A, a core substrate is prepared. This core substrate is manufactured by a plating via-hole method. An inner layer conductor pattern is formed on a glass fabric epoxy resin copper-clad laminated plate or a glass fabric highly heat-resistant copper-clad laminated plate. The above-mentioned laminated plates of the necessary number are prepared, laminated and bonded by a bonding sheet such as a prepreg to form one board. Via-holes are formed on this board, wall surfaces and surfaces of the via-holes are plated by the plating via-hole method and inner and outer conductive layers are connected. After that, a surface pattern is formed and the core substrate is manufactured.

Figure 7B:
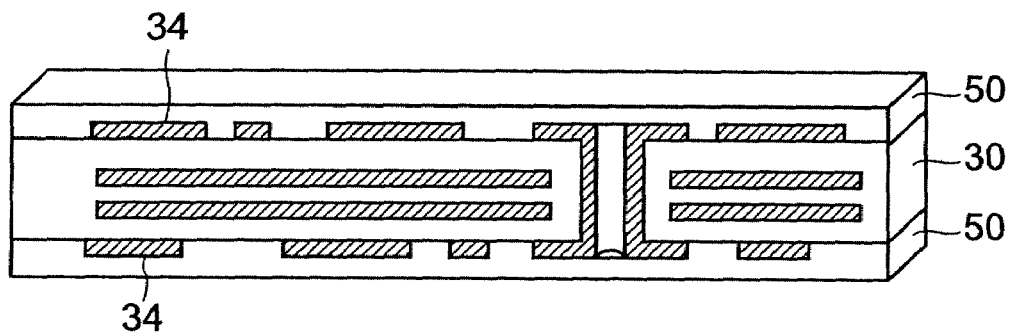
FIG. 7B is a diagram to which reference will be made in explaining a treatment process to form an insulating film on the core substrate.

As shown in FIG. 7B, an insulating layer is formed on the core substrate. This insulating layer may be formed on the core substrate by either coating a liquid-like insulator or a laminating method for compression bonding a film-like insulator with heat in the vacuum atmosphere.

Figure 7C:
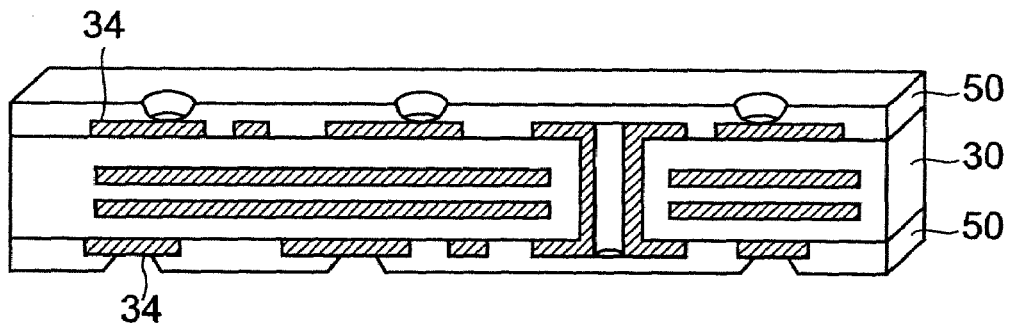
FIG. 7C is a diagram to which reference will be made in explaining a treatment process to form via-holes on the insulating layer with laser irradiation.

As shown in FIG. 7C, via-holes are formed on the insulating layer with laser irradiation.

Figure 7D:
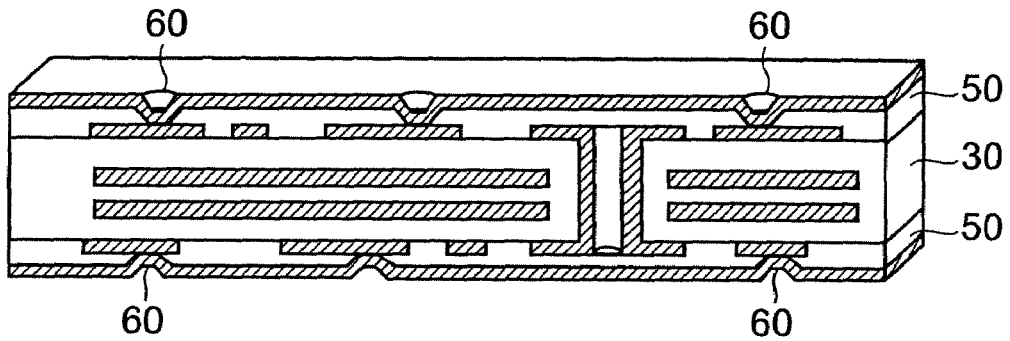
FIG. 7D is a diagram to which reference will be made in explaining a treatment process to make the inner surface of the via-hole and the surface of the insulating layer become conducted by electroless copper plating.

As shown in FIG. 7D, the inner surfaces of the via-holes and the surface of the insulating layer are plated by electroless plating and thereby conducted. At that time, the inner surfaces of the via-holes and the surface of the insulating layer are treated by a surface-roughening treatment in order to increase adhesion of plating.

Figure 7E:
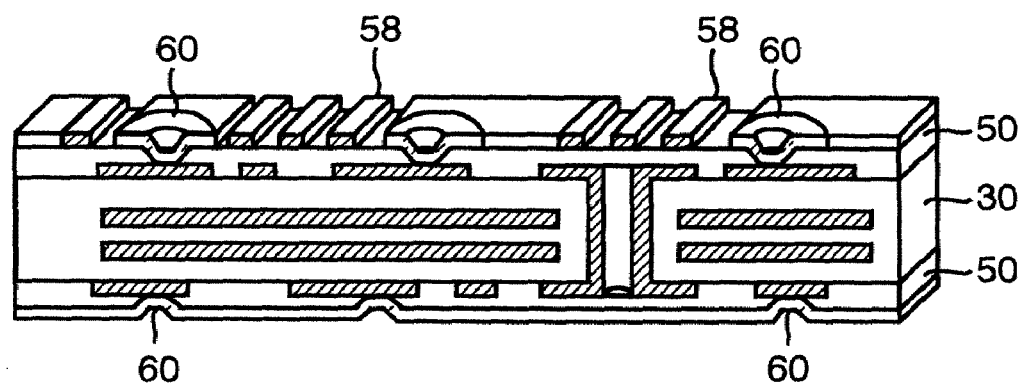
FIG. 7E is a diagram to which reference will be made in explaining treatment processes to form conductor patterns on the front and back of the core substrate.

As shown in FIG. 7E, a conductor pattern is formed on the front of the substrate. In order to form the conductor pattern on the front of the substrate, panel plating is carried out in order to plate the whole surface by electrolytic copper plating and the etching resist is formed on the upper surface of the copper plating, whereafter the conductor pattern is formed on the surface of the substrate by etching (subtractive method). It should be noted that other methods such as a semi-additive method and a full-additive method also can be used to form the conductor pattern.

Figure 7F:
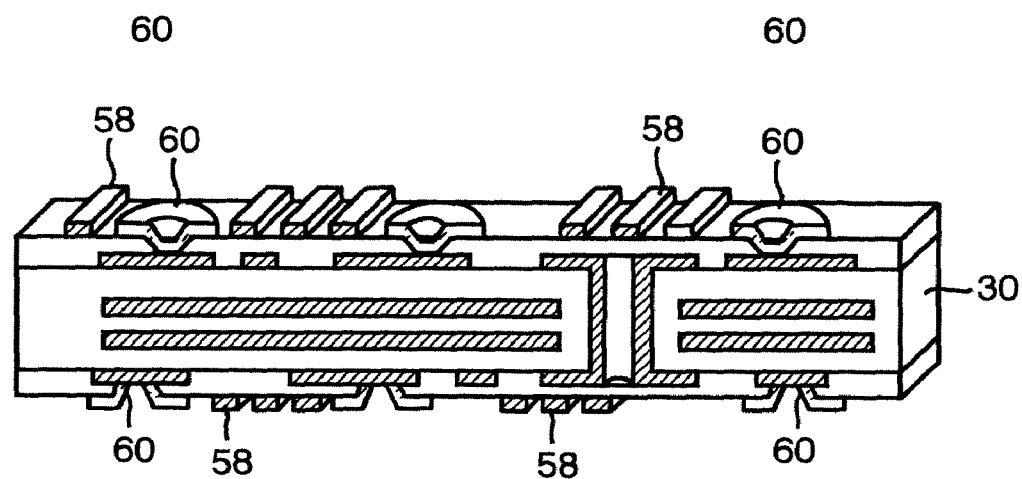
FIG. 7F is a diagram to which reference will be made in explaining a treatment process to form a conductor pattern on the back of the core substrate in a manner similar to that of FIG. 7E.

As shown in FIG. 7F, a conductor pattern also is formed on the back of the substrate in a like manner. Because the conductor pattern of one layer is formed at this stage, the processes of FIGS. 7B to 7F are repeatedly carried out the desired number of times.

Figure 7G:
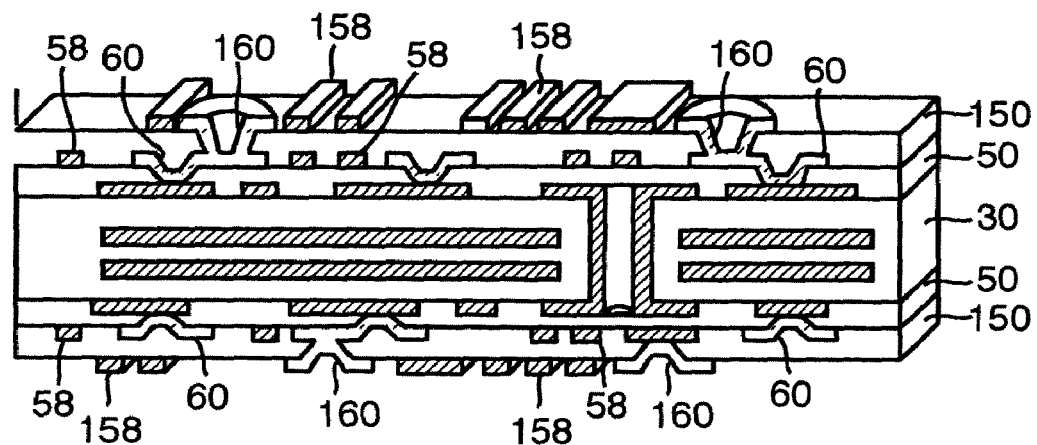
FIG. 7G is a diagram showing a manner in which a multilayer printed wiring board is manufactured by repeating the processes shown in FIGS. 7B to 7F one more time.

As shown in FIG. 7G, here, a multilayer printed wiring board is manufactured by repeating the processes of FIGS. 7B to 7F the desired number of times. If desired, a solder resist layer (not shown) may be formed on the outermost layer. It should be noted that the conductor pattern of the outermost layer may be matched with the patterns that have been described so far with reference to the first and second embodiments although not shown in FIGS. 7A to 7G.

[Advantages and Effects of the Embodiments]

(1) According to the embodiments of the present invention, electronic components of different connection systems (flip-chip connection system and non-flip-chip connection system) and the like can be mounted on both of or either of the front and back of the multilayer printed wiring board.

(2) According to the embodiments of the present invention, from the standpoints of melting points of solders, volumes (heat capacities) of solder bumps or forms and mounting systems of electronic components, it is possible to determine compositions and shapes of solder bumps on the multilayer printed wiring board and mounting order of components and the like.

(3) According to the embodiments of the present invention, in addition to differences of volumes (heat capacities) of solder bumps and taking melting points of solders into consideration or in addition to differences of forms of electronic components and mounting systems and taking melting points of solders, it is possible to determine compositions and shapes of solder bumps on the multilayer printed wiring board and mounting order of components and the like.

[Modified Example and the Like]

While the embodiments of the multilayer printed wiring board and the component mounting method thereof according to the present invention have been described so far, these embodiments are described by way of example and it is needless to say that the present invention is not limited to those embodiments. The present invention may be added, varied and deleted by those skilled in the art.

The scope of the present invention may be determined based on the scope of the appended claims.

It should be understood by those skilled in the art that various modifications, combinations, sub-combinations and alterations may occur depending on design requirements and other factors insofar as they are within the scope of the appended claims or the equivalents thereof.

What is claimed is:

1. A method of mounting a component on a multilayer printed wiring board, the method comprising:

forming a first solder bump on either a front side or a back side of the multilayer printed wiring board, the first solder bump having a first melting point temperature;

forming a second solder bump on either the front side or the back side of the multilayer printed wiring board, the second solder bump having a second melting point temperature which is less than the first melting point temperature;

forming a third solder bump on either the front side or the back side of the multilayer printed wiring board, the third solder bump having a third melting point temperature which is less than the first melting point temperature and less than the second melting point temperature; and mounting at least one electronic component on the multilayer printed wiring board by performing a first soldering operation using the first solder bump, performing a second soldering operation using the second solder bump, and performing a third soldering operation using the third solder bump, wherein the first, second and third soldering operations are performed sequentially, wherein:

the first melting point temperature is a first temperature range, the second melting point temperature is a second temperature range and the third melting point temperature is a third temperature range, a low range endpoint of the second temperature range is higher than a low range endpoint of the third temperature range by 25° C., a low range endpoint of the first temperature range is higher than a low range endpoint of the second temperature range by 24° C., a high range endpoint of the second temperature range is higher than a high range endpoint of the third temperature range by 30° C., and a high range endpoint of the first temperature range is higher than a high range endpoint of the second temperature range by 30° C., and the first, second and third temperature ranges do not overlap with each other.

2. A method of mounting a component on a multilayer printed wiring board, the method comprising:

forming a first solder bump on either a front side or a back side of the multilayer printed wiring board, the first solder bump having a first melting point temperature;

forming a second solder bump on either the front side or the back side of the multilayer printed wiring board, the second solder bump having a second melting point temperature which is less than the first melting point temperature;

forming a third solder bump on either the front side or the back side of the multilayer printed wiring board, the third solder bump having a third melting point temperature which is less than the first melting point temperature and less than the second melting point temperature; and mounting at least one electronic component on the multilayer printed wiring board by performing a first soldering operation using the first solder bump, performing a second soldering operation using the second solder bump, and performing a third soldering operation using the third solder bump, wherein the first, second and third soldering operations are performed sequentially, wherein said mounting at least one electronic component comprises:

mounting a first electronic component using the first solder bump, the first electronic component being a surface-mounting type component of a non-flip-chip connection system, mounting a second electronic component using the second solder bump, the second electronic component being a component of a non-flip-chip connection system, and mounting a third electronic component using the third solder bump, the third electronic component being a surface-mounting type component of a non-flip-chip connection system.

3. The method of claim 1, wherein said mounting at least one electronic component comprises:

mounting a chip capacitor on the front side of the multilayer printed wiring board using the first solder bump, mounting a conductive connection pin on the back side of the multilayer printed wiring board using the second solder bump, and mounting an IC chip on the front side of the multilayer printed wiring board using the third solder bump.

4. A method of mounting a component on a multilayer printed wiring board, the method comprising:

forming a first solder bump on either a front side or a back side of the multilayer printed wiring board, the first solder bump having a first melting point temperature;

forming a second solder bump on either the front side or the back side of the multilayer printed wiring board, the second solder bump having a second melting point temperature which is less than the first melting point temperature;

forming a third solder bump on either the front side or the back side of the multilayer printed wiring board, the third solder bump having a third melting point temperature which is less than the first melting point temperature and less than the second melting point temperature;

mounting at least one electronic component on the multilayer printed wiring board by performing a first soldering operation using the first solder bump, performing a second soldering operation using the second solder bump, and performing a third soldering operation using the third solder bump, wherein the first, second and third soldering operations are performed sequentially, and further comprising forming a fourth solder bump on either the front side or the back side of the multilayer printed wiring board, the fourth solder bump having a fourth melting point temperature which is different from the first, second and third melting point temperatures and the melting point of the third solder bump is higher than the melting point of the fourth solder bump.

5. The method of claim 4, wherein said mounting at least one electronic component comprises:

mounting a first electronic component by using the first solder bump, then, mounting a second electronic component by using the second solder bump, then, mounting a third electronic component by using the third solder bump, and then, mounting a fourth electronic component by using the fourth solder bump.

6. The method of claim 5, wherein the first electronic component is a surface-mounting type component of a non-flip-chip connection system, the second electronic component is a surface-mounting type component of a flip-chip connection system, the third electronic component is a surface-mounting type component of a flip-chip connection system, and the fourth electronic component is a surface-mounting type component of a non-flip-chip connection system.

7. The method of claim 6, wherein:

said mounting a first electronic component comprises mounting a chip capacitor on the front side of the multilayer printed wiring board, said mounting a second electronic component comprises mounting an IC chip on the front side of the multilayer printed wiring board, said mounting a third electronic component comprises mounting a memory on the back side of the multilayer printed wiring board, and said mounting a fourth electronic component comprises mounting a chip capacitor on the back side of the multilayer printed wiring board.

8. A method of mounting a component on a multilayer printed wiring board, the method comprising:

forming a first solder bump on either a front side or a back side of the multilayer printed wiring board, the first solder bump having a first melting point temperature;

forming a second solder bump on either the front side or the back side of the multilayer printed wiring board, the second solder bump having a second melting point temperature which is less than the first melting point temperature;

forming a third solder bump on either the front side or the back side of the multilayer printed wiring board, the third solder bump having a third melting point temperature which is less than the first melting point temperature and less than the second melting point temperature; and mounting at least one electronic component on the multilayer printed wiring board by performing a first soldering operation using the first solder bump, performing a second soldering operation using the second solder bump, and performing a third soldering operation using the third solder bump, wherein the first, second and third soldering operations are performed sequentially, wherein said mounting at least one component comprises:

mounting a chip capacitor on the front side of the multilayer printed wiring board using the first solder bump, mounting an IC chip on the front side of the multilayer printed wiring board using the second solder bump, mounting a semiconductor device immediate voltage adjuster on the back side of the multilayer printed wiring board using the third solder bump, and mounting a chip capacitor on the back side of the multilayer printed wiring board using the fourth solder bump.

9. A method of mounting a component on a multilayer printed wiring board, the method comprising:

forming a first solder bump on either a front side or a back side of the multilayer printed wiring board, the first solder bump having a first melting point temperature;

forming a second solder bump on either the front side or the back side of the multilayer printed wiring board, the second solder bump having a second melting point temperature which is less than the first melting point temperature;

forming a third solder bump on either the front side or the back side of the multilayer printed wiring board, the third solder bump having a third melting point temperature which is less than the first melting point temperature and less than the second melting point temperature; and mounting at least one electronic component on the multilayer printed wiring board by performing a first soldering operation using the first solder bump, performing a second soldering operation using the second solder bump, and performing a third soldering operation using the third solder bump, wherein the first, second and third soldering operations are performed sequentially, wherein:

at least two solder bumps of the first, second and third solder bumps comprising a larger volume solder bump and a smaller volume solder bump, and a solder operation for the larger volume solder bump is performed before a solder operation for the smaller volume solder bump.

10. The method of claim 5, wherein:

at least two solder bumps of the first, second, third and fourth solder bumps comprising a larger volume solder bump and a smaller volume solder bump, and a solder operation for the larger volume solder bump is performed before a solder operation for the smaller volume solder bump.

11. A method of mounting a component on a multilayer printed wiring board, the method comprising:

forming a first solder bump on either a front side or a back side of the multilayer printed wiring board, the first solder bump having a first melting point temperature;

forming a second solder bump on either the front side or the back side of the multilayer printed wiring board, the second solder bump having a second melting point temperature which is less than the first melting point temperature;

forming a third solder bump on either the front side or the back side of the multilayer printed wiring board, the third solder bump having a third melting point temperature which is less than the first melting point temperature and less than the second melting point temperature; and mounting at least one electronic component on the multilayer printed wiring board by performing a first soldering operation using the first solder bump, performing a second soldering operation using the second solder bump, and performing a third soldering operation using the third solder bump, wherein the first, second and third soldering operations are performed sequentially, wherein:

a solder operation for electronic components having relatively small component load per connection point is performed before a solder operation of other electronic components having a relatively large component load per connection point.

12. The method of claim 5, wherein:

a solder operation for electronic components having relatively small component load per connection point is performed before a solder operation of other electronic components having a relatively large component load per connection point.

\* \* \* \* \*